(12) United States Patent
Ma et al.

(10) Patent No.: US 12,411,405 B2
(45) Date of Patent: Sep. 9, 2025

(54) OPTICAL PROXIMITY CORRECTION BASED ON COMBINING INVERSE LITHOGRAPHY TECHNOLOGY WITH PATTERN CLASSIFICATION

(71) Applicant: Siemens Industry Software Inc., Plano, TX (US)

(72) Inventors: Yuansheng Ma, Fremont, CA (US); Le Hong, Benicia, CA (US); Rui Wu, Clifton Park, NY (US); Junjiang Lei, Reno, NV (US)

(73) Assignee: Siemens Industry Software Inc., Plano, TX (US)

( * ) Notice: Subject to any disclaimer, the term of this patent is extended or adjusted under 35 U.S.C. 154(b) by 435 days.

(21) Appl. No.: 17/823,679

(22) Filed: Aug. 31, 2022

(65) Prior Publication Data
US 2023/0095028 A1 Mar. 30, 2023

Related U.S. Application Data

(60) Provisional application No. 63/249,676, filed on Sep. 29, 2021.

(51) Int. Cl.
*G03F 1/36* (2012.01)
*G03F 1/70* (2012.01)
*G06F 30/27* (2020.01)
*G06F 30/398* (2020.01)

(52) U.S. Cl.
CPC .......... *G03F 1/36* (2013.01); *G03F 1/70* (2013.01); *G06F 30/27* (2020.01); *G06F 30/398* (2020.01)

(58) Field of Classification Search
CPC ... G03F 1/36; G03F 1/70; G06F 30/27; G06F 30/398
See application file for complete search history.

(56) References Cited

U.S. PATENT DOCUMENTS

| | | | |
|---|---|---|---|
| 8,434,031 B2 | 4/2013 | Granik | |
| 8,788,982 B2 | 7/2014 | Lippincott et al. | |
| 2013/0198700 A1* | 8/2013 | Sakajiri | G03F 1/36 716/53 |
| 2019/0266311 A1* | 8/2019 | Abouelseoud | G06F 30/398 |

(Continued)

OTHER PUBLICATIONS

Yuansheng Ma, et at. "Reduction of Systematic Defects With Machine Learning from Design to Fab," 2020, pp. 1-15, Proc. SPIE 11329, San Jose, CA, United States.

(Continued)

*Primary Examiner* — Nha T Nguyen (57) ABSTRACT

Various aspects of the present disclosed technology relate to techniques for inverse-lithography-technology-based optical proximity correction. A layout design is received. A machine learning-based clustering process is then performed to separate layout features in the layout design into groups of layout features. For layout features in each of the groups of layout features, preliminary corrections are determined. The determination may be based on inverse lithography technology. The preliminary corrections are applied to the layout design to generate a pre-processed layout design. An inverse lithography technology process is performed on the pre-processed layout design to generate a processed layout design. Masks can be manufactured based on the processed layout design.

19 Claims, 8 Drawing Sheets

Flow chart 600

(56) References Cited

U.S. PATENT DOCUMENTS

| | | | |
|---|---|---|---|
| 2020/0174380 A1* | 6/2020 | Huang | G06N 3/045 |
| 2021/0048741 A1* | 2/2021 | Lugg | G06N 20/00 |
| 2022/0010467 A1 | 1/2022 | Tanaka et al. | |
| 2022/0010468 A1 | 1/2022 | Hague et al. | |
| 2022/0010469 A1 | 1/2022 | Willard et al. | |
| 2023/0034170 A1* | 2/2023 | Fujimura | G03F 1/78 |
| 2023/0071777 A1* | 3/2023 | Im | G03F 7/70441 |
| 2023/0341765 A1* | 10/2023 | Chu | G03F 1/22 |

OTHER PUBLICATIONS

Sergey Kobelkov, et al. "Constraint approaches for some Inverse Lithography problems with Pixel-based Mask," 2018, pp. 1-8, Proc. SPIE 10587, San Jose, CA, United States.

Linyong Pang, "Inverse lithography technology: 30 years from concept to practical, full-chip reality," Jul.-Sep. 2021, pp. 1-49, J. Micro/Nanopattern. Mater. Metrol., 030901-1, vol. 20(3), San Jose, CA, United States.

Thomas Cecil, et al. "Establishing Fast, Practical, Full-chip ILT Flows Using Machine Learning," 2020, pp. 1-19, Proc. SPIE 11327, San Jose, CA, United States.

* cited by examiner

OPTICAL PROXIMITY CORRECTION BASED ON COMBINING INVERSE LITHOGRAPHY TECHNOLOGY WITH PATTERN CLASSIFICATION

RELATED APPLICATIONS

This application claims the benefit of U.S. Provisional Patent Application No. 63/249,676, filed on Sep. 29, 2021, titled "Optical Proximity Correction Based On Combining Inverse Lithography Technology With Pattern Classification," and naming Yuansheng Ma et al. as inventors, which application is incorporated entirely herein by reference.

FIELD OF THE DISCLOSED TECHNOLOGY

The present disclosed technology relates to the field of circuit design and manufacture. Various implementations of the disclosed technology may be particularly useful for optical proximity correction.

BACKGROUND OF THE DISCLOSED TECHNOLOGY

As designers and manufacturers continue to shrink the size of circuit components, the shapes reproduced on the substrate (wafer) though photolithography become smaller and are placed closer together. This reduction in feature size and spacing increases the difficulty of faithfully reproducing the image onto the substrate intended by the design layout and can create flaws in the manufactured device. To address the problem, one or more resolution enhancement techniques are often employed to improve the resolution of the image that the mask forms on the substrate during the photolithographic process.

One of resolution enhancement techniques, "optical proximity correction" or "optical process correction" (OPC), tries to compensate for light diffraction effects. When light illuminates the photomask, the transmitted light diffracts. The higher spatial frequencies the regions of the mask have, the higher angles the light diffracts at. The resolution limits of the lens in a photolithographic system make the lens act effectively as a low-pass filter for the various spatial frequencies in the two-dimensional layout. This can lead to optical proximity effects such as a pull-back of line-ends from their desired position, corner rounding and a bias between isolated and dense structures (the so-called iso-dense bias problem). The optical proximity correction adjusts the amplitude of the light transmitted through a lithographic mask by modifying the layout design data employed to create the photomask. For example, edges in the layout design may be adjusted to make certain portions of the geometric elements larger or smaller, in accordance with how much additional light exposure (or lack of exposure) is desired at certain points on the substrate. When these adjustments are appropriately calibrated, overall pattern fidelity is greatly improved, thereby reducing optical proximity effects.

OPC can be rule-based, model-based, or both. In rule-based OPC, the proximity effects are characterized and specific solutions are devised for specific geometric configurations. The layout design is then searched using a DRC tool or a geometric-based software engine to find these geometric configurations. Once they are found, the specific solutions are applied. Rule-based OPC approaches work well for simple cases. For complex layout features, however, model-based OPC approaches need to be employed to obtain desired results. Model-based OPC performs simulation to predict the printed image, which guides layout modifications.

Recently inverse lithography technology (ILT) has become mainstream for the advanced technology nodes. Inverse lithography technology, as the name suggested, is a mathematically inverse approach for determining mask patterns: given a known forward transformation from mask patterns to images for a specified lithography process, it computes an optimized mask that produces the desired wafer target with best pattern fidelity and/or largest process window. The optimized mask patterns are not limited to simple modifications of the target patterns. First, the optimized mask patterns derived for targeted layout features in an inverse lithography technology process tend to be curvilinear in nature, which can provide better lithographic quality than Manhattan patterns. Second, sub-resolution assist features (SRAFs) are automatically generated in an inverse lithography technology process, unlike a conventional OPC process in which SRAFs are heuristically inserted. SRAFs can make a relatively isolated main feature behave lithographically more like a densely-placed main feature and thus can reduce the previously mentioned iso-dense bias problem, The iso-dense bias problem can be caused by variations in focus condition and off-axis illumination, a major resolution enhancement technology, makes it more significant. With curvilinear main features and sub-resolution assist features both being automatically generated, inverse lithography technology can deliver better quality of results for mask synthesis designs than conventional OPC techniques. Despite recent advances in the area of inverse lithography technology, however, the runtime problem associated with ILT computation remains a challenge for full-chip applications.

BRIEF SUMMARY OF THE DISCLOSED TECHNOLOGY

Various aspects of the present disclosed technology relate to techniques for inverse-lithography-technology-based optical proximity correction. In one aspect, there is a method comprising: receiving a layout design; performing a machine learning-based clustering process to separate layout features in the layout design into groups of layout features; determining preliminary corrections for layout features in each of the groups of layout features; applying the preliminary corrections to the layout design to generate a pre-processed layout design; performing an inverse lithography technology process on the pre-processed layout design to generate a processed layout design; and storing information of the processed layout design. The method may further comprise: manufacturing masks based on the processed layout design.

The machine learning-based clustering process may comprise: extracting a feature vector for each of the layout features; and mapping the set of feature vectors into hyper-boxes of a hyperspace.

The determining preliminary corrections may be based on performing another inverse lithography technology process for each of the groups of layout features. The another inverse lithography technology process and the inverse lithography technology process may employ the same inverse lithography technology model.

The performing an inverse lithography technology process may comprise: determining parameters (recipe) for the inverse lithography technology process based on layout features selected from each of the groups of layout features.

The performing inverse lithography technology process may comprise: performing a first inverse lithography technology sub-process to generate sub-resolution assist features; and performing a second inverse lithography technology sub-process to generate the processed layout design.

In another aspect, there is one or more computer-readable media storing computer-executable instructions for causing one or more processors to perform the above method.

In still another aspect, there is a system, comprising: one or more processors, the one or more processors programmed to perform the above method.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed technology. Thus, for example, those skilled in the art will recognize that the disclosed technology may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNOLOGY

General Considerations

Various aspects of the present disclosed technology relate to techniques for inverse-lithography-technology-based optical proximity correction. In the following description, numerous details are set forth for the purpose of explanation. However, one of ordinary skill in the art will realize that the disclosed technology may be practiced without the use of these specific details. In other instances, well-known features have not been described in detail to avoid obscuring the present disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "perform", "determine", and "generate" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one micro device, such as data to be used to form multiple micro devices on a single wafer.

Illustrative Operating Environment

The execution of various electronic design automation processes according to embodiments of the disclosed technology may be implemented using computer-executable software instructions executed by one or more programmable computing devices. Because these embodiments of the disclosed technology may be implemented using software instructions, the components and operation of a generic programmable computer system on which various embodiments of the disclosed technology may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the disclosed technology.

Figure 1:
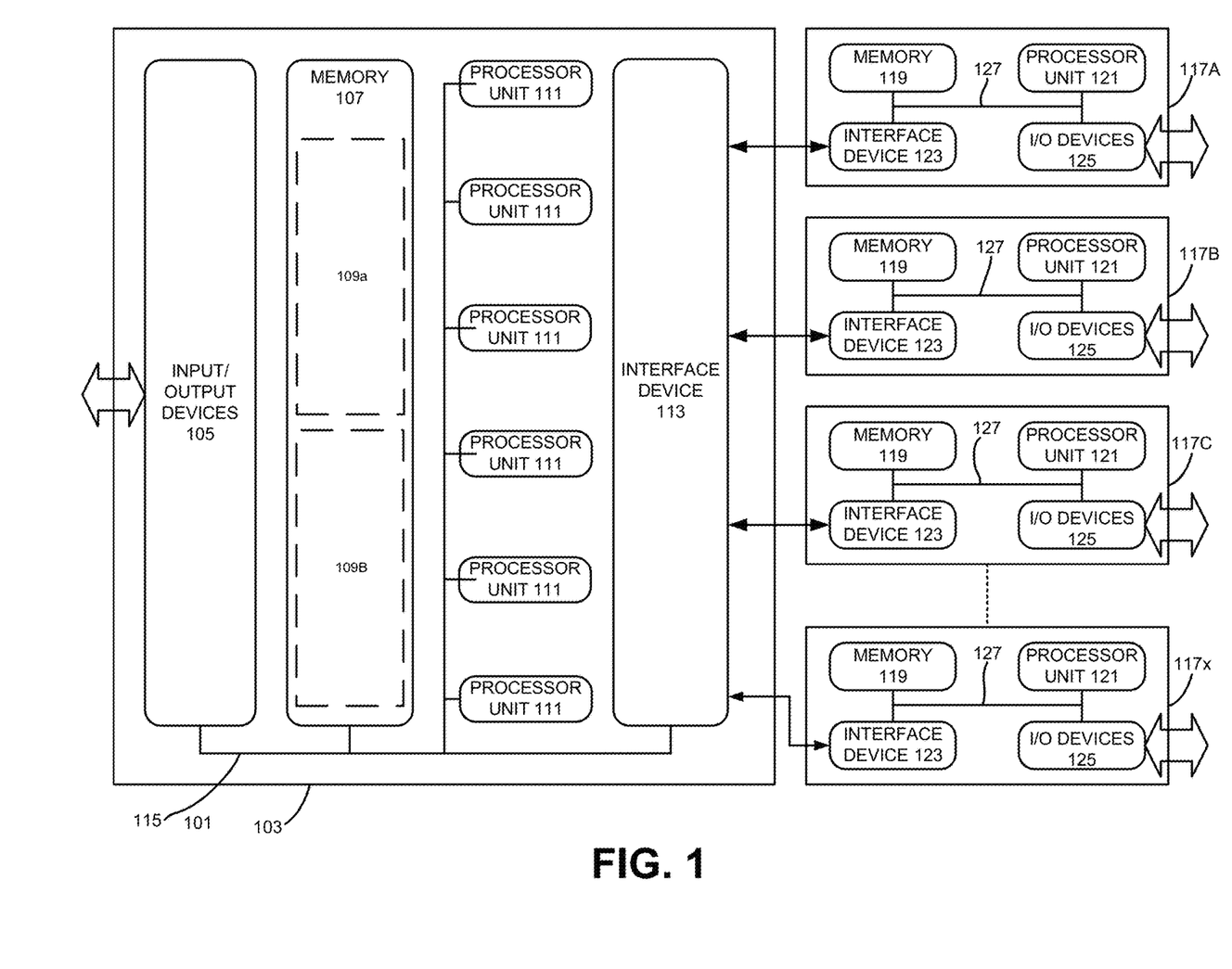
FIG. 1 illustrates an example of a computing system that may be used to implement various embodiments of the disclosed technology.

In FIG. 1, the computer network 101 includes a master computer 103. In the illustrated example, the master computer 103 is a multi-processor computer that includes a plurality of input and output devices 105 and a memory 107.

The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the disclosed technology. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
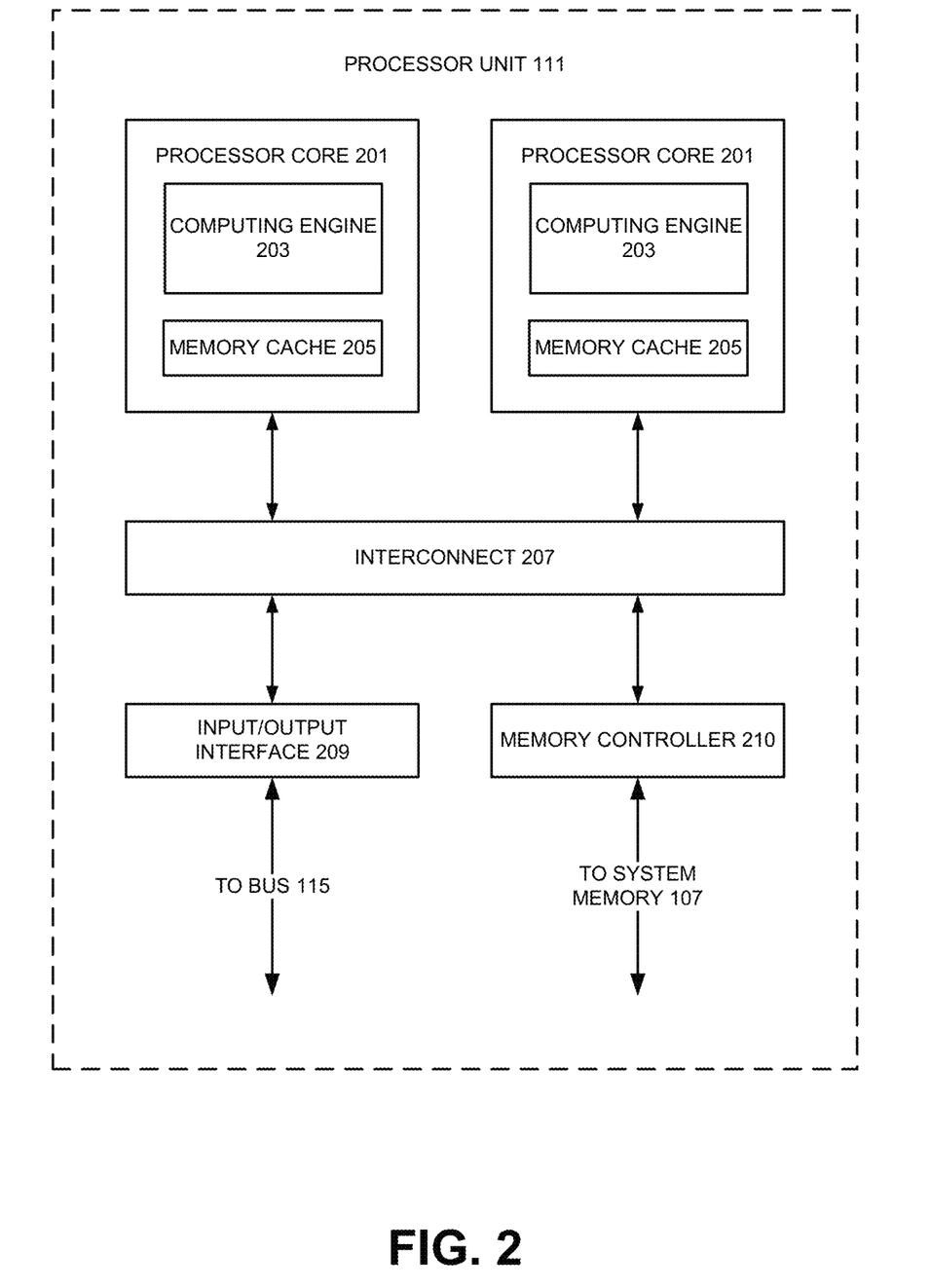
FIG. 2 illustrates an example of a multi-core processor unit that may be used to implement various embodiments of the disclosed technology.

With some implementations of the disclosed technology, the master computing device 103 may employ one or more processing units 111 having more than one processor core. Accordingly, FIG. 2 illustrates an example of a multi-core processor unit 111 that may be employed with various embodiments of the disclosed technology. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOT and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 111. With some processor cores 201, such as the Cell microprocessor created by Sony Corporation, Toshiba Corporation and IBM Corporation, the interconnect 207 may be implemented as an interconnect bus. With other processor units 111, however, such as the Opteron™ and Athlon™ dual-core processors available from Advanced Micro Devices of Sunnyvale, California, the interconnect 207 may be implemented as a system request interface device. In any case, the processor cores 201 communicate through the interconnect 207 with an input/output interface 209 and a memory controller 210. The input/output interface 209 provides a communication interface between the processor unit 111 and the bus 115. Similarly, the memory controller 210 controls the exchange of information between the processor unit 111 and the system memory 107. With some implementations of the disclosed technology, the processor units 111 may include additional components, such as a high-level cache memory accessible shared by the processor cores 201.

While FIG. 2 shows one illustration of a processor unit 111 that may be employed by some embodiments of the disclosed technology, it should be appreciated that this illustration is representative only, and is not intended to be limiting. Also, with some implementations, a multi-core processor unit 111 can be used in lieu of multiple, separate processor units 111. For example, rather than employing six separate processor units 111, an alternate implementation of the disclosed technology may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the disclosed technology, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the disclosed technology may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the disclosed technology, either the computer 103, one or more of the servant computers 117, or some combination of both may use two or more different interface devices 113 or 123 for communicating over multiple communication interfaces.

With various examples of the disclosed technology, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the disclosed technology, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the disclosed technology.

Circuit Design Flow and Optical Proximity Correction

Electronic circuits, such as integrated microcircuits, are used in a variety of products such as automobiles, personal computers, data center servers, and smart phones. Designing and fabricating integrated circuit devices typically involves many steps, sometimes referred to as a "design flow." The particular steps of a design flow often are dependent upon the type of integrated circuit, its complexity, the design team, and the integrated circuit fabricator or foundry that will manufacture the microcircuit. Typically, software and hardware "tools" verify the design at various stages of the design flow by running software simulators and/or hardware emulators. These steps aid in the discovery of errors in the design, and allow the designers and engineers to correct or otherwise improve the design.

Several steps are common to most design flows. Initially, the specification for a new circuit is transformed into a logical design, sometimes referred to as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. This device design generally corresponds to the level of representation displayed in conventional circuit diagrams. The relationships between the electronic devices are then analyzed, to confirm that the circuit described by the device design will correctly perform the desired functions. This analysis is sometimes referred to as "formal verification." Additionally, preliminary timing estimates for portions of the circuit are often made at this stage, using an assumed characteristic speed for each device, and incorporated into the verification process.

Once the components and their interconnections are established, the design is again transformed, this time into a physical design that describes specific geometric elements. This type of design often is referred to as a "layout" design. The geometric elements, which typically are polygons, define the shapes that will be created in various layers of material to manufacture the circuit. For digital circuits, automated place and route tools will be used to define the physical layouts, especially of wires that will be used to interconnect the circuit devices. Each layer of the microcircuit will have a corresponding layer representation in the layout design, and the geometric shapes described in a layer representation will define the relative locations of the circuit elements that will make up the circuit device. For example, shapes in the layer representation of a metal layer will define the locations of the metal wires used to connect the circuit devices. Custom layout editors, such as Mentor Graphics' IC Station or Cadence's Virtuoso, allow a designer to custom design the layout, which is mainly used for analog, mixed-signal, RF, and standard-cell designs.

Integrated circuit layout descriptions can be provided in many different formats. The Graphic Data System II (GDSII) format is a popular format for transferring and archiving two-dimensional graphical IC layout data. Among other features, it contains a hierarchy of structures, each structure containing layout elements (e.g., polygons, paths or poly-lines, circles and textboxes). Other formats include an open source format named Open Access, Milkyway by Synopsys, Inc., EDDM by Mentor Graphics, Inc., and the more recent Open Artwork System Interchange Standard (OASIS) proposed by Semiconductor Equipment and Materials International (SEMI). These various industry formats are used to define the geometrical information in IC layout designs that are employed to manufacture integrated circuits. Once the microcircuit device design is finalized, the layout portion of the design can be used by fabrication tools to manufacture the device using a photolithographic process.

Typically, a designer will perform a number of verification processes on the layout design. For example, the layout design may be analyzed to confirm that it complies with various design requirements, such as minimum spacing between geometric elements and minimum linewidths of geometric elements. In this process, a DRC (design rule checking) tool takes as input a layout in the GDSII standard format and a list of rules specific to the semiconductor process chosen for fabrication. A set of rules for a particular process is referred to as a run-set, rule deck, or just a deck. An example of the format of a rule deck is the Standard Verification Rule Format (SVRF) by Mentor Graphics Corporation.

The layout design are also analyzed to confirm that it accurately represents the circuit devices and their relationships described in the device design. A conventional LVS (layout versus schematic) process comprises two phases: extraction and comparison. In the extraction phase, a netlist is extracted from the layout design. The netlist includes not only types of and connectivity between the devices but also device parameters. In the comparison phase, the LVS tool compares the extracted netlist with the source netlist which is taken from the circuit schematic, and reports violations if any. LVS can be augmented by formal equivalence checking, which checks whether two circuits perform exactly the same function without demanding isomorphism.

As designers and manufacturers continue to shrink the size of circuit components, the shapes reproduced on the substrate through photolithography become smaller and are placed closer together. This reduction in feature size and spacing increases the difficulty of faithfully reproducing the image onto the substrate intended by the design layout and can create flaws in the manufactured device. To address the problem, one or more resolution enhancement techniques are often employed to improve the resolution of the image that the mask forms on the substrate during the photolithographic process.

One of resolution enhancement techniques, "optical proximity correction" or "optical process correction" (OPC), tries to compensate for light diffraction effects. When light illuminates the photomask, the transmitted light diffracts. The higher spatial frequencies the regions of the mask have, the higher angles the light diffracts at. The resolution limits of the lens in a photolithographic system make the lens act effectively as a low-pass filter for the various spatial frequencies in the two-dimensional layout. This can lead to optical proximity effects such as a pull-back of line-ends from their desired position, corner rounding and a bias between isolated and dense structures. The optical proximity correction can adjust the amplitude of the light transmitted through a lithographic mask by modifying the layout design data employed to create the photomask. For example, edges in the layout design may be adjusted to make certain portions of the geometric elements larger or smaller, in accordance with how much additional light exposure (or lack of exposure) is desired at certain points on the substrate. When these adjustments are appropriately calibrated, overall pattern fidelity is greatly improved, thereby reducing optical proximity effects.

Figure 3A:
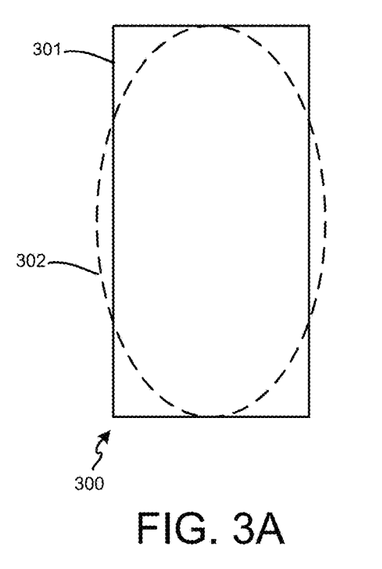
FIG. 3A illustrates a mask feature and a simulated image of the mask feature.
Figure 3B:
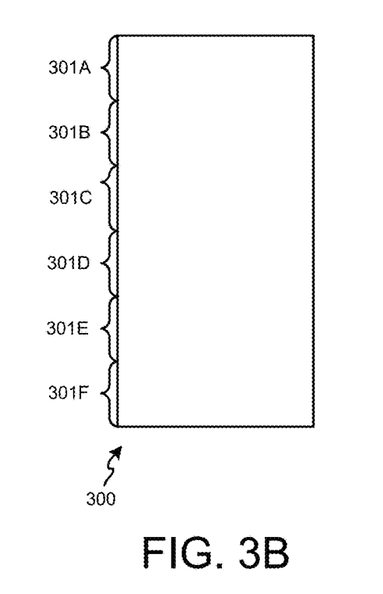
FIG. 3B illustrates an example of fragmentation of an edge of the mask feature in FIG. 3A.
Figure 3C:
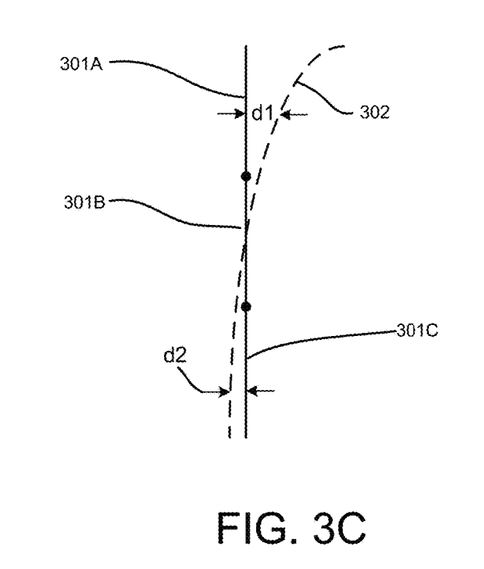
FIG. 3C illustrates edge displacement errors for some of the edge fragments.

As noted previously, OPC can be rule-based, model-based, or both. In a typical model-based OPC process, polygons in the layout design are divided into edge fragments to allow the desired fine motion of edge fragments. FIGS. 3A-3D illustrates an example. An edge 301 of a layout feature 300 in FIG. 3A may be fragmented into edge fragments 301A-301F as shown in FIG. 3B. The size of the edge fragments and which particular edges are to be fragmented in a given layout design depends upon the OPC process parameters, often referred to as the OPC recipe. While not all edges within a layout design are fragmented in every OPC process, these edges may also be referred to as edge fragments. Simulation is performed to obtain the predicted printed image 302 for the layout feature 300 shown in FIG. 3A. This simulated image is compared to the target image. Typically, this comparison is done at each edge fragment. For example, as shown in FIG. 3C, the target image is a distance d1 away from the simulated image at the edge fragment 301A, the target image is a distance d2 away from the simulated image at the edge fragment 301C, while the target image intersects the simulated image at the edge fragment 301B. The distances between the target image and the simulated image are often referred to as edge placement error (EPE).

Figure 3D:
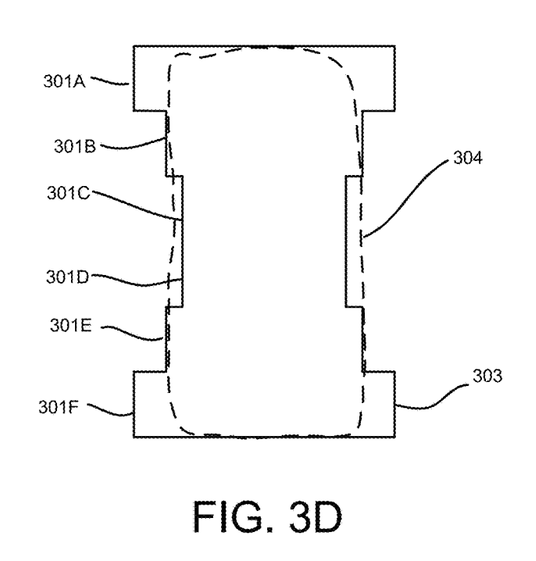
FIG. 3D illustrates a mask feature modified from the mask feature in FIG. 3A by an OPC process and a corresponding simulated image.

Next, the edge fragments are individually moved or adjusted in order to enable the simulated image for the resulting mask to reproduce the target image as much as possible. For example, as shown in FIG. 3D, the edge fragments 301A and 301F are displaced in a direction away from the layout feature 300, in an effort to widen the corresponding portion of the image that would be produced by the resulting mask. Similarly, the edge fragments 301C and 301D are displaced in a direction toward the layout feature 300, in an effort to narrow the corresponding portion of the image that would be produced by the resulting mask. Next, the image that would be produced by a mask using the displaced edge fragments is simulated, and the new simulated image is compared with the target image, and the edge placement error for each edge fragment is computed.

This process of moving the edge fragments, simulating the image that would be produced using the moved edge fragments, and comparing the simulated image to the target image may be repeated a number of times. Each cycle of moving edge fragments and comparing the new simulated image to target image is referred to as an iteration of the OPC process. Typically, edge fragments moved during a given iteration, and the distance the edge fragments are displaced, are determined based upon the edge placement error. For example, because d1 is larger than d2 in FIG. 3C, a subsequent iteration of the optical proximity correction process may move edge fragment 301A a greater amount than edge fragment 301C.

The movement value for each edge fragment, often referred to as edge adjustment values or edge displacement values, may be the edge placement error multiplied by a constant factor (feedback factor). This feedback factor may be location dependent or edge type dependent based on the OPC recipe. Methods that consider correlations between neighboring edge fragments such as those described in U.S. Pat. Nos. 8,910,098 and 8,881,070, which are incorporated herein by reference, may also be employed to derive the movement value (referred to as cross-MEEF (mask error enhancement factor)-based methods).

The OPC iteration process continues until the simulated image is sufficiently similar to the target image (e.g., both d1 and d2 are smaller than a threshold value), or until it is determined that the displacements of the edge fragments already have converged on locations where no further movement of the edge fragments will improve the simulated image. Once the final positions of the edge fragments are determined in the layout design data, as shown in FIG. 3D, a modified mask feature 303 can be created from the corrected layout design data. As shown in FIG. 3D, the image 304 produced by the modified mask feature 303 should more closely correspond to the target image.

Inverse Lithography Technology

Inverse lithography technology computes an optimized mask that produces the desired wafer target with best pattern fidelity and/or largest process window in a specific lithographic process. The specific lithographic process can be represented by a transformation function which transforms mask patterns into desired wafer patterns. The transformation function can account for not only optics of the particular photolithography equipment and electromagnetics of the three-dimensional (3D) mask pattern, but also behavior of the photoresist in the light exposure, resist development and etching processes. Inverse lithography technology can be considered as searching for an inverse function of the transformation function. However, the transformation function may correspond to more than one inverse functions. Further, an exact mathematical solution for mask may not exist for a given inverse function. As such, inverse lithography technology typically treats the optical proximity correction problem as a constraint optimization problem over the domain of pixilated masks to be solved iteratively.

In solving the optimization problem, an inverse lithography technology tool can employ a cost function representing the "goodness" of the mask solution. Eq. (1) shows an example cost function G that expresses a deviation of the image I(x,y) from the threshold constant T along the target contours $C_i$:

$$G = \sum_i \oint_{C_i} (I(\xi, \eta) - T)^2 dl \rightarrow \min. \quad (1)$$

Here $\zeta = \zeta(l)$ and $\eta = \eta(l)$ are Cartesian coordinates along the target contours; dl represents a contour integration element. The image I(x,y) is controlled by the mask, thus G depends on the mask transmission m=m(x,y), a complex-valued piece-wise constant function. Thus the constrained optimization problem may be stated as finding the mask m=m(x,y) that minimizes $$G[m] \rightarrow \min, \quad (2)$$

while constraining acceptable values of the mask transmission function to the constants $m_{min}$ and 1. For chrome masks $m_{min}=0$. For OMOG (opaque MoSi on glass) masks $m_{min}$ is a complex constant $m_{min} \approx (0.023, -0.022)$. The inverse lithography technology tool tries to find an analytical representation of the gradient of the objective, and then may use fast Fourier transformation to quickly calculate it.

The analytical expression for the gradient of the objective can be found by perturbing the mask m→m+δm and then finding the linear part of the perturbation of the objective δG. In the case of the cost function shown in Eq. (1), the following analytical expression for the gradient may be obtained:

$$g(x, y) = 4\text{Re} \sum_{k=1}^{N} \lambda_k \sum_i \int_{C_i} (I(\varsigma, \eta) - T) A_k^*(\xi, \eta) K_k(\xi - x, \eta - y) dl \quad (3)$$

$$I(x, y) = \sum_{k=1}^{N} \lambda_k A_k^*(x, y) A_k(x, y)$$

$$A_k = K_k(x, y) \otimes m(x, y)$$

where N is the total number of optical kernels, $\lambda_n$ are weights of the optical kernels, $A_n$ is the electrical field from the n-th kernel $K_n$. The discretized version of (3) can be quickly calculated through fast Fourier transformations.

Figure 4A:
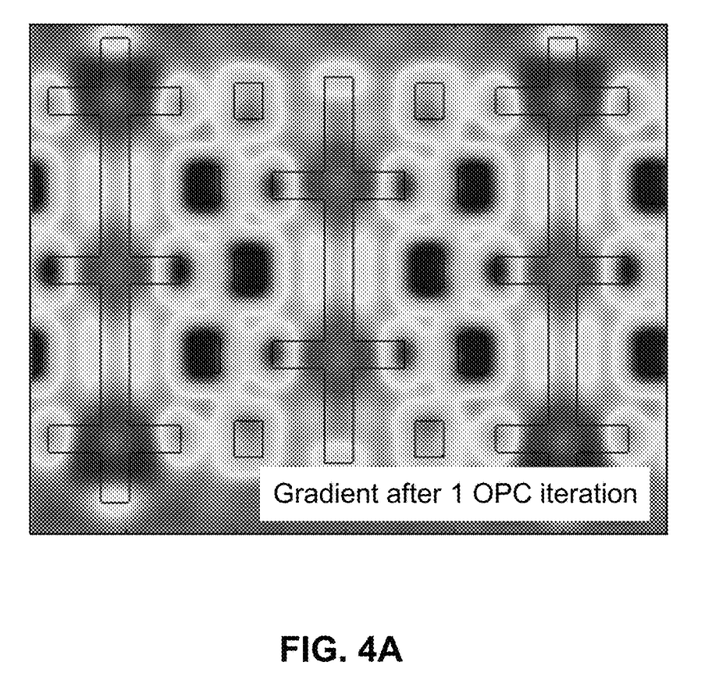
FIG. 4A illustrates an example of a mask pattern after one iteration.
Figure 4B:
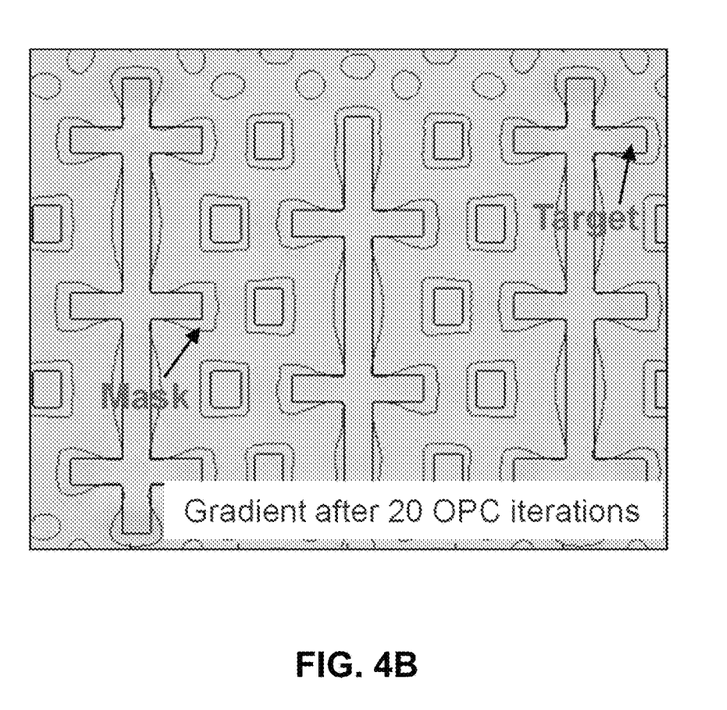
FIG. 4B illustrates an example of a mask pattern after 20 iterations.

The gradient g(x,y) of the objective is used in an iterative procedure to move mask contours or to modify mask transmissions in a manner that reduced the value of the cost function G. Sub-resolution assist features (SRAFs) are automatically generated in such an inverse lithography process. FIG. 4A illustrates an example of a mask pattern after one iteration and FIG. 4B illustrates an example of a mask pattern after 20 iterations. In the figures, the gradient is represented by colors. The bright yellow and blue colors indicate regions where the mask contour should be expanded while the dark orange and red colors indicate regions where the mask contour should be contracted. After one iteration, the gradient magnitude varies across the design patterns. After 20 iterations, the gradient magnitude becomes smaller and the cost function approaches a minimum.

The above described ILT approach is just one example. There are various other ILT approaches which the disclosed technology can employ.

Optical Proximity Correction Tool

Figure 5:
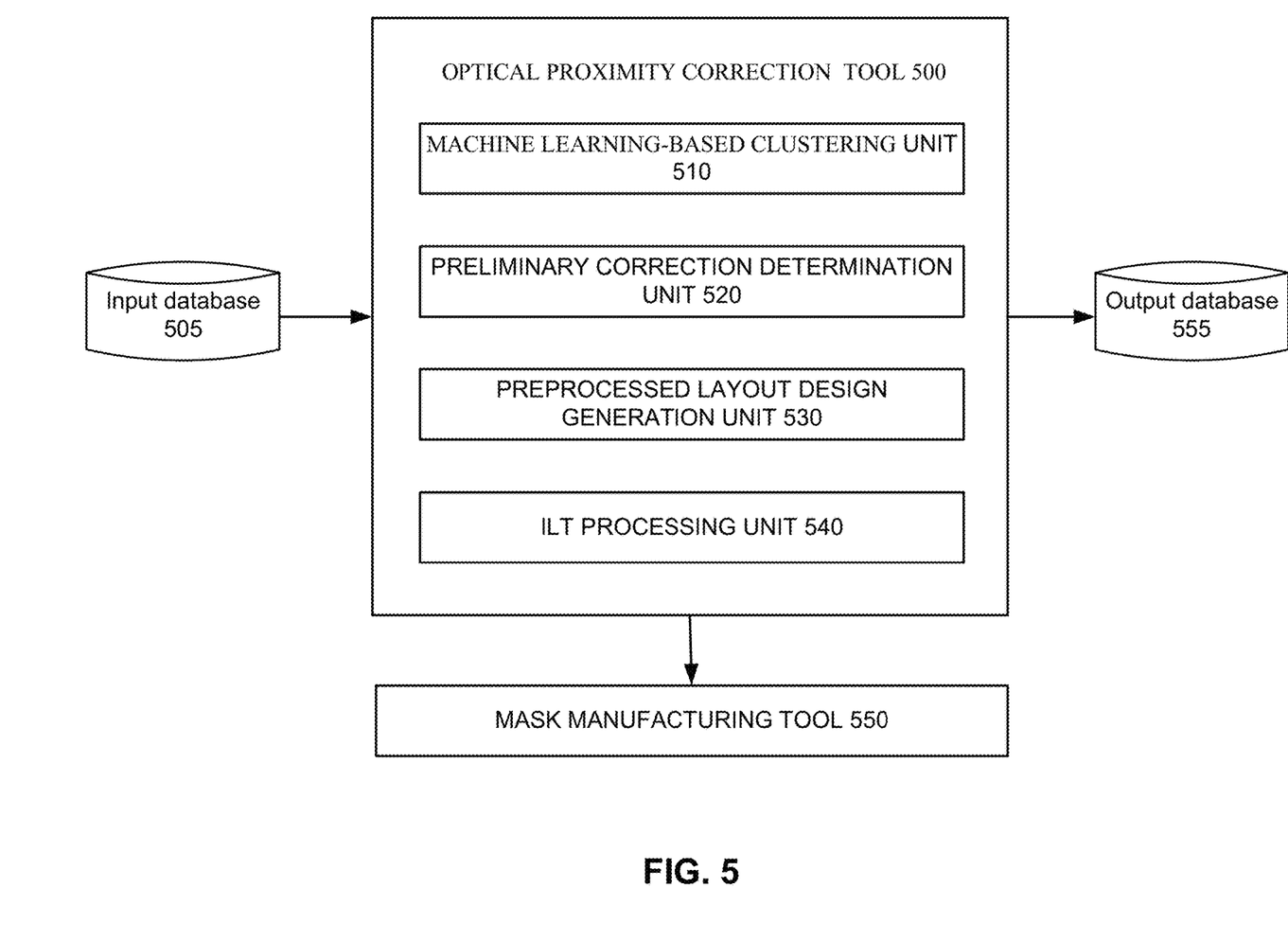
FIG. 5 illustrates an example of an optical proximity correction tool that may be implemented according to various embodiments of the disclosed technology.

FIG. 5 illustrates an example of an optical proximity correction tool 500 that may be implemented according to various embodiments of the disclosed technology. As seen in this figure, the optical proximity correction tool 500 includes a machine learning-based clustering unit 510, a preliminary correction determination unit 520, a preprocessed layout design generation unit 530, and an ILT processing unit 540. Various implementations of the optical proximity correction tool 500 may cooperate with (or incorporate) one or more of a mask manufacturing tool 550, an input database 505 and an output database 555.

As will be discussed in more detail below, the optical proximity correction tool 500 can receive a layout design from the input database 505. The machine learning-based clustering unit 510 can perform a machine learning-based clustering process to separate layout features in the layout design into clusters of layout features. The preliminary correction determination unit 520 can determine preliminary corrections for layout features in each of the groups of layout features. The preprocessed layout design generation unit 530 can apply the preliminary corrections to the layout design to generate a pre-processed layout design. The ILT processing unit 540 can perform an inverse lithography technology process on the pre-processed layout design to generate a processed layout design. The optical proximity correction tool 500 can store information of the processed layout design into the output database 555. The mask manufacturing tool 550 can manufacture masks based on the processed layout design.

As previously noted, various examples of the disclosed technology may be implemented by one or more computing systems, such as the computing system illustrated in FIGS. 1 and 2. Accordingly, one or more of the machine learning-based clustering unit 510, the preliminary correction determination unit 520, the preprocessed layout design generation unit 530, and the ILT processing unit 540 may be implemented by executing programming instructions on one or more processors in one or more computing systems, such as the computing system illustrated in FIGS. 1 and 2. Correspondingly, some other embodiments of the disclosed technology may be implemented by software instructions, stored on a non-transitory computer-readable medium, for instructing one or more programmable computers/computer systems to perform the functions of one or more of the machine learning-based clustering unit 510, the preliminary correction determination unit 520, the preprocessed layout design generation unit 530, and the ILT processing unit 540. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, or a solid state storage device.

It also should be appreciated that, while the machine learning-based clustering unit 510, the preliminary correction determination unit 520, the preprocessed layout design generation unit 530, and the ILT processing unit 540 are shown as separate units in FIG. 5, a single computer (or a single processor within a master computer) or a single computer system may be used to implement some or all of these units at different times, or components of these units at different times. In some embodiments of the disclosed technology, the preliminary correction determination unit 520 employs an inverse lithography technology method. As such, the preliminary correction determination unit 520 may be the same as the ILT processing unit 540 or these two units may share some common components.

With various examples of the disclosed technology, the input database 505 and the output database 555 may be implemented using any suitable computer readable storage device. That is, either of the input database 505 and the output database 555 may be implemented using any combination of computer readable storage devices including, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable storage devices may also include magnetic cassettes, magnetic tapes, magnetic disks or other magnetic storage devices, holographic storage devices, or any other non-transitory storage medium that can be used to store desired information. While the input database 505 and the output database 555 are shown as separate units in FIG. 5, a single data storage medium may be used to implement some or all of these databases.

Pattern Clustering-Based Inverse Lithography Technology Process

Figure 6:
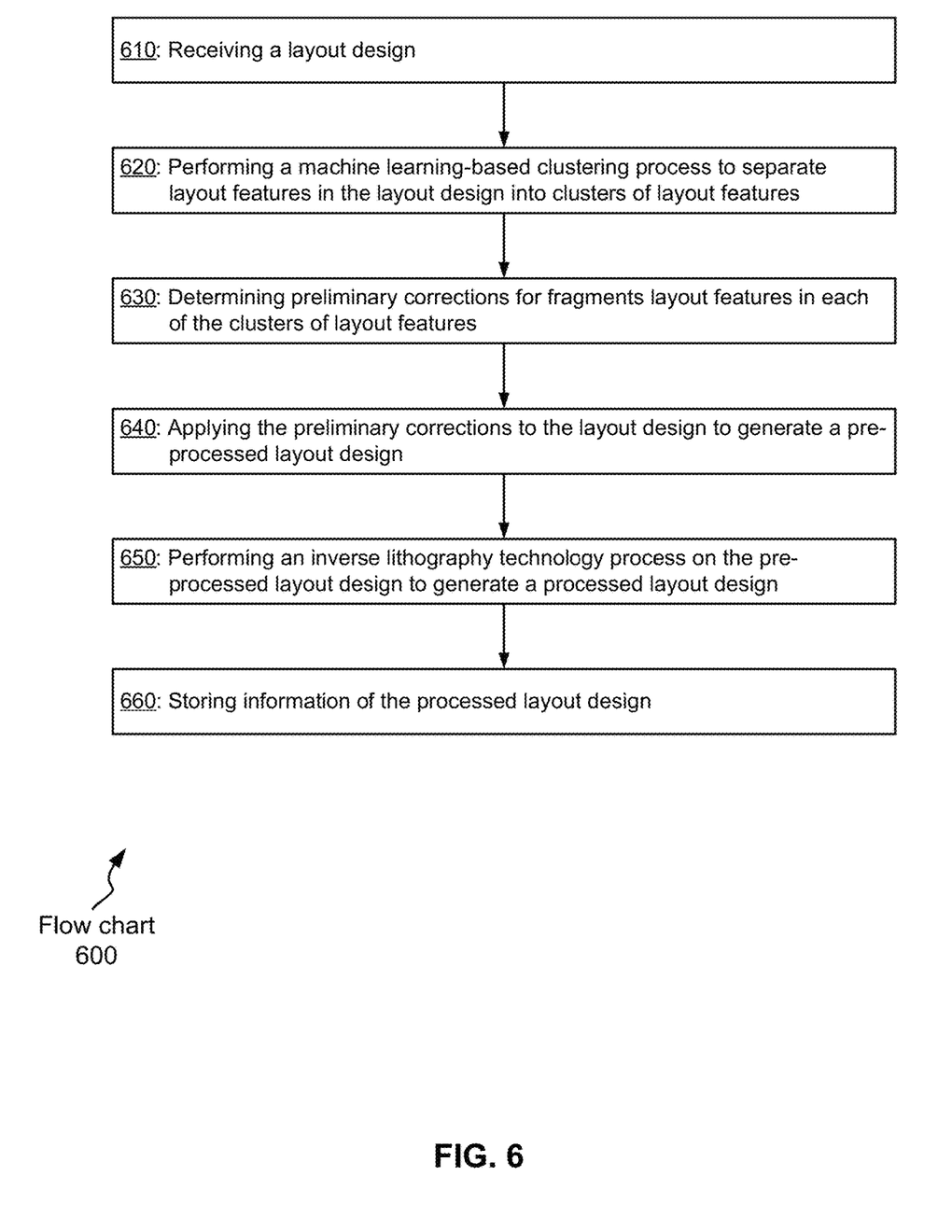
FIG. 6 illustrates a flowchart showing a pattern clustering-based inverse lithography technology process that may be implemented according to various examples of the disclosed technology.

FIG. 6 illustrates a flowchart 600 showing a pattern clustering-based inverse lithography technology process that may be implemented according to various examples of the disclosed technology. For ease of understanding, methods of pattern clustering-based inverse lithography technology that may be employed according to various embodiments of the disclosed technology will be described with reference to the optical proximity correction tool 500 in FIG. 5 and the flow chart 600 illustrated in FIG. 6. It should be appreciated, however, that alternate implementations of an optical proximity correction tool may be used to perform the methods of pattern clustering-based inverse lithography technology illustrated by the flow chart 600 according to various embodiments of the disclosed technology. Likewise, the optical proximity correction tool 500 may be employed to perform other methods of pattern clustering-based inverse lithography technology according to various embodiments of the disclosed technology.

In operation 610 of the flow chart 600, the optical proximity correction tool 500 receives a layout design from the input database 505. The layout design may be in the GDSII standard format or the OASIS standard format. The layout design may be derived from a circuit design using a place and route tool. Alternatively, the layout design may be one that has been processed by a resolution enhancement tool. The layout design may represent a full-chip design or a portion of a full-chip design.

In operation 620, the machine learning-based clustering unit 510 performs a machine learning-based clustering process to separate layout features in the layout design into groups of layout features. Layout features can be edge fragments or layout patterns comprising polygons. The machine learning-based clustering unit 510 can employ various machine learning-based clustering techniques. One of them is a hyperspace-based machine learning technique. In the hyperspace-based machine learning process, the machine learning-based clustering unit 510 can first extract a feature vector for each of the layout features. To extract the feature vector for a particular layout feature, a layout region centered at the layout feature may be considered. The size of a layout region can be set based upon the range of diffraction or process effects. Printing errors of a layout feature can be caused by its neighboring layout features. How far away a neighboring layout feature can affect the printability depends at least in part on the wavelength of the light source used for lithography. The size of a layout region can thus be set as several multiples of the wavelength or the minimum line spacing that can be achieved in a particular technology node. In a state-of-the-art deep ultraviolet (DUV) lithography process, the light source is 193 nm excimer lasers. The minimum metal line width in single exposure for the 7 nm or 10 nm technology node is about 40 nm. Accordingly, the layout region can be set as, for example, 200 nm in radius for a circle shape or 400 nm in side length for a square shape.

The feature vector can comprise density-based components. For example, each density-based component of the feature vector can correspond to a ring in a plurality of rings. The plurality of rings do not overlap with each other and cover a whole area of a circle when being placed together. To derive values of the density-based components for a layout feature, the machine learning-based clustering unit 510 can place the set of rings on the layout region centered at the layout feature and compute the percentage of area in each of the rings occupied by layout features in the layout region. Additionally or alternatively, the feature vector can comprise other types of components.

In the hyperspace-based machine learning technique, a hyperspace may refer to or include a coordinate space with multiple dimensions to map multiple parameter values of data points in a dataset (whether directly or as transformed parameters), and with at least a portion of the coordinate system partitioned into hyperboxes. Hyperboxes of a generated hyperspace may be used to process large datasets in an efficient and accurate manner. As described in greater detail herein, a hyperspace may be generated by transforming a feature space of a dataset (feature vectors) and quantizing the transformed feature space into hyperboxes. Processing of the dataset may be performed by processing the quantized hyperboxes of the hyperspace that contain at least one or more mapped feature vectors of the dataset. The hyperspace generation and hyperspace-based processing features may have $O(n)$ complexity, and the described hyperspace features may thus exhibit increased computational efficiency and speed as compared to other $O(n^2)$ processing techniques such as K-means clustering and Mahalanobis cluster computations.

Figure 7:
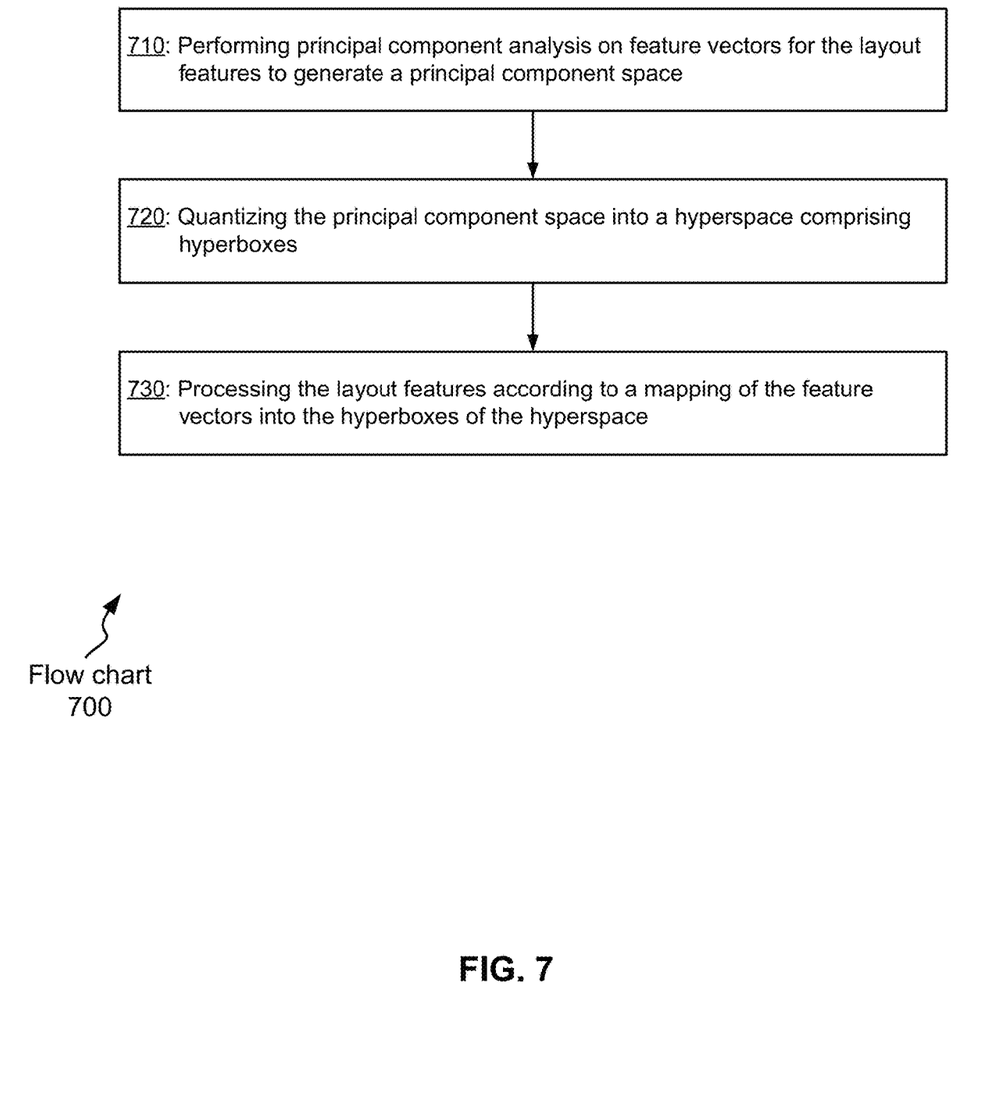
FIG. 7 illustrates a flowchart showing a process for using a hyperspace-based machine learning technique to classify layout features that may be implemented according to various examples of the disclosed technology.

FIG. 7 illustrates a flowchart 700 showing a process for using a hyperspace-based machine learning technique to classify layout features that may be implemented according to various examples of the disclosed technology. In operation 710, the machine learning-based clustering unit 510 performs principal component analysis (or any other multivariate transformation) on feature vectors to generate a principal component space. The space where the feature vectors are located may be referred to as feature space. The feature vectors are extracted from layout regions centered at the layout features, respectively, to represent the layout features. In another word, the layout features are mapped in the feature space as the feature vectors. By performing principal component analysis on the feature vectors, the machine learning-based clustering unit 510 can map the feature vectors into the principal component space, which is a different coordinate system that further correlates the parameter values of the layout features and supports variance determinations through the transformation.

In some implementations, the machine learning-based clustering unit 510 may perform the transformation from a feature space into a corresponding principal component space using a covariance (or correlation) matrix. Eigenvectors of the covariance matrix may represent how each parameter of a feature space maps to each principal component of the principal component space. The machine learning-based clustering unit 510 may further determine eigenvalues for each principal component of a principal component space, and determined principal component eigenvalues may represent the dataset variance attributable to the principal component (e.g., a higher eigenvalue may indicate that a given principal component exhibits, measures, or characterizes a greater data variance relative to other principal components with lower eigenvalues). The transformation can be equivalent to a rotation of the principal component axes from the feature space based on eigenvalues determined for the principal components of the principal component space.

In operation 720, the machine learning-based clustering unit 510 quantizes the principal component space into a hyperspace comprising hyperboxes. The machine learning-based clustering unit 510 can determine dimension values of the hyperboxes to specifically account for variance among parameters of the principal component space (e.g., based on variance attributable to the principal components of the transformed feature space). Quantizing the principal component space may refer to partitioning at least a portion of the principal component space into hyperboxes. A hyperbox may refer to an 'n'-dimensional enclosed shape with hyperbox dimension values along each dimension of the principal component space. In particular, the number of dimensions of hyperboxes may be equal to the number of dimensions of the principal component space. According to some embodiments of the disclosed technology, the machine learning-based clustering unit 510 can set the dimension size of hyperboxes along one principal component axis of the first principal component as a function of a value range for the first principal component and a predetermined divider value. The first principal component may be the principal component having the highest variance among the principal components of the principal component space. In particular, the machine learning-based clustering unit 510 may determine a value range (between a minimum value and a maximum value) of the first principal component for the set of feature vectors mapped into the principal component space. The machine learning-based clustering unit 510 may then divide the value range by the predetermined divider value. By adjusting the divider value, the machine learning-based clustering unit 510 can flexibly control how granular, precise, sparse, or dense the hyperbox partitioning in a quantized hyperspace will be. For the remaining principal components, the machine learning-based clustering unit 510 may determine dimension values as a function of the value range for the remaining principal components respectively, the predetermined divider value, and a variance ratio between the first and the remaining principal components respectively (e.g., as measured through the determined eigenvalues of the principal components). By accounting for variance ratios in hyperbox dimension value determinations, the machine learning-based clustering unit 510 may partition a range of values along a particular principal component for a transformed feature space at lesser granularity or precision as compared to the number of partitions for the first principal component. Quantizing the principal component space into a hyperspace comprised of hyperboxes effectively partitions the principal component space into different bins, clusters, or partitions. Each hyperbox of the hyperspace may act as a cluster element by which the layout features can be processed. The machine learning-based clustering unit 510 can vary the number of bins/clusters/partitions by changing the divider value. Hyperbox dimension determination and transformed feature space quantization may be performed in O (n) time, allowing for clustering of transformed feature vectors for layout features with increased computational efficiency while nonetheless supporting analyses that account for dataset variance.

In operation 730, the machine learning-based clustering unit 510 processes the layout features according to a mapping of the feature vectors into the hyperboxes of the hyperspace. The machine learning-based clustering unit 510 can use the covariance matrix to map the feature vectors into the hyperspace. Each of the transformed feature vectors may be bound by a respective hyperbox in the hyperspace. The transformed feature vectors encapsulated by the same hyperbox may form a cluster for processing purposes. As such, the machine learning-based clustering unit 510 may group these multiple feature vectors (and corresponding layout features) as part of a same cluster.

Figure 8:
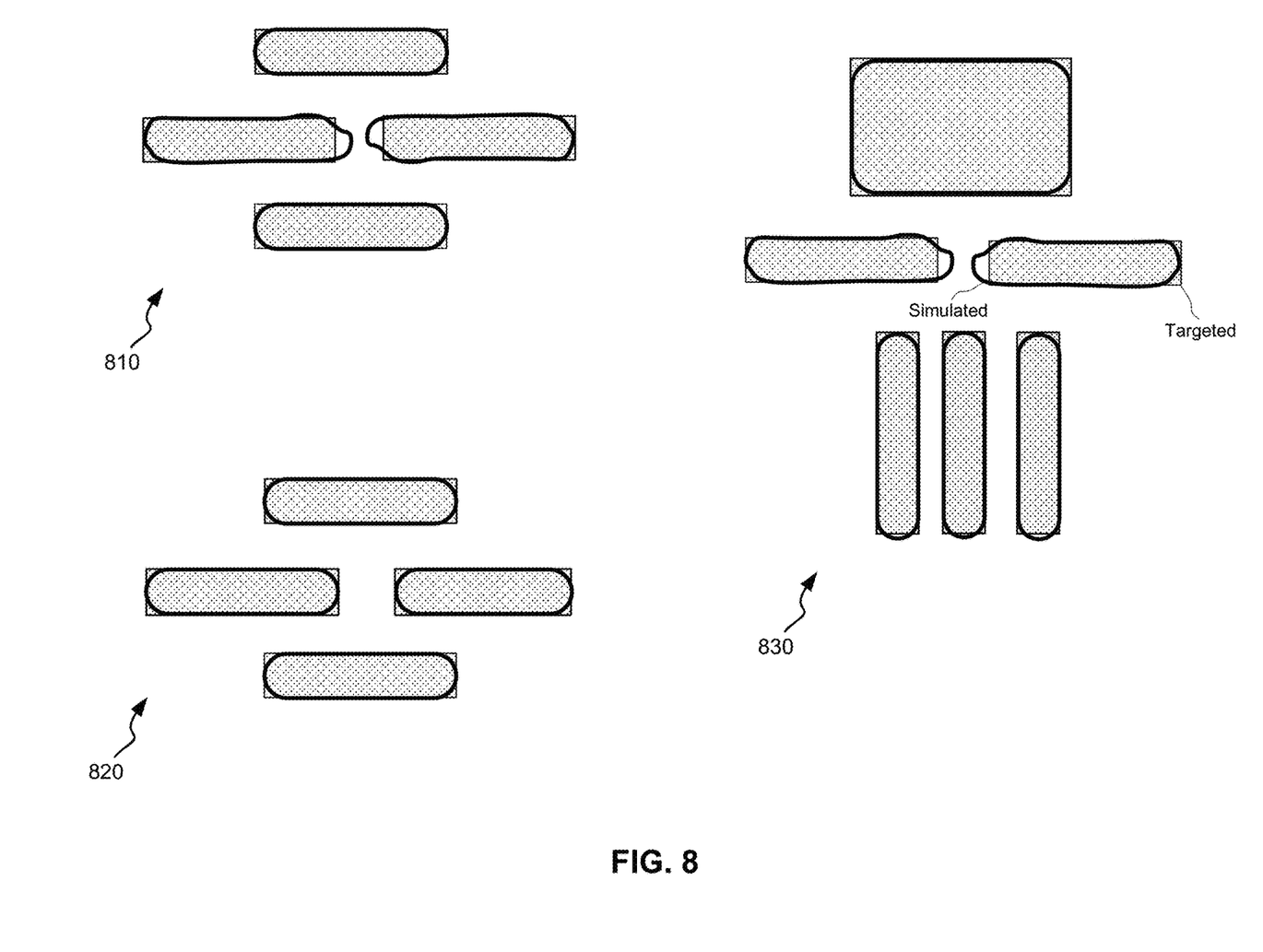
FIG. 8 illustrates an example clustering result from a hyperspace-based machine learning process.

FIG. 8 illustrates an example clustering result from a hyperspace-based machine learning process. The figure shows both targeted and simulated wafer contours of three layout features 810, 820 and 830. In appearance, the layout features 810 and 820 are more similar to each other than either of them is to the layout feature 830. However, the hyperspace-based machine learning process groups the layout features 810 and 830 together but assigns the layout feature 820 to another group. This clustering result actually correlates well with design and fab printing behavior since the simulated wafer contours of the layout features 810 and 830 indicates the same printability problem (bridging) in a lithography process while the simulated wafer contours of the layout feature 820 does not.

Referring back to FIG. 6, in operation 630, the preliminary correction determination unit 520 determines preliminary corrections for layout features in each of the groups of layout features. The preliminary correction determination unit 520 can employ an inverse lithography technology method for this operation. The parameters of an inverse lithography technology model, sometimes also referred to as recipe, can affect the mask and lithography quality of the result. The mask and lithography quality can be measured in terms of edge placement error (EPE) convergence, process variation band, common depth of focus, and some other characteristics. The parameters of an inverse lithography technology model can be tuned and calibrated using layout features selected from a layout design before they are used in an inverse lithography technology process for the layout design. The recipe tuning can be an iterative process.

To determine preliminary corrections for layout features in each of the groups of layout features, the preliminary correction determination unit 520 can first determine a recipe for each of the groups of layout features. This can be accomplished by selecting layout features from each of the groups of layout features and using these selected layout features to tune the parameters. This process may not need many iterations and thus can be fast because layout features in each of the groups of layout features have similar design and fab printing behavior as discussed above. Once the recipe is determined, the preliminary correction determination unit 520 can use the inverse lithography technology model to determine preliminary corrections for layout features in the each of the groups of layout features. For the same reason, this process can be fast and the resulted preliminary corrections can have high mask and lithography quality. It should be noted that the preliminary correction determination unit 520 may employ an optical proximity method that is not inverse lithography technology-based to determine the preliminary corrections.

In operation 640, the preprocessed layout design generation unit 530 applies the preliminary corrections to the layout design to generate a pre-processed layout design. The preliminary corrections may comprise information about how edge fragments of a polygon in a group of layout features should be moved. Accordingly, the preprocessed layout design generation unit 530 can move all corresponding edge fragments in the group of layout features in the same direction and by the same amount as the preliminary corrections. Additionally or alternatively, the preliminary corrections may comprise a new curvilinear pattern for a polygon in a group of layout features. Then the preprocessed layout design generation unit 530 can replace all corresponding polygons in the group of layout features with the same curvilinear pattern.

In operation 650, the ILT processing unit 540 performs an inverse lithography technology process on the pre-processed layout design to generate a processed layout design. The ILT processing unit 540 may employ the same inverse lithography technology model as the one employed by the preliminary correction determination unit 520 or a different one. In either case, the ILT processing unit 540 can first use layout features selected from each of the groups of layout features to determine a recipe for the whole pre-processed layout design. Compared to layout features randomly selected, layout features selected using the machine learning-based clustering method can cover more unique patterns. Thus the recipe can be not only obtained faster but also in a better quality than the one obtained using randomly selected layout features. The ILT processing unit 540 can obtain the processed layout design in one inverse lithography technology. Alternatively, the ILT processing unit 540 can perform a first inverse lithography technology sub-process to generate sub-resolution assist features and then perform a second inverse lithography technology sub-process to generate the final processed layout design.

In operation 660, the optical proximity correction tool 500 stores information of the processed layout design into the output database 555. The optical proximity correction tool 500 may further perform mask process correction (MPC) on the processed layout design. Although the photomask features are typically used in a 4× reduction system, and the feature dimensions are thus 4× larger than on the wafer, there is still need to accurately fabricate SRAF and other OPC jogs and structures that are significantly smaller. Mask process correction attempts to correct charged particle proximity effects. The mask manufacturing tool 550 can manufacture masks based on the processed layout design. The masks can be used to fabricate chips through photolithography.

CONCLUSION

While the disclosed technology has been described with respect to specific examples including presently preferred modes of carrying out the disclosed technology, those skilled in the art will appreciate that there are numerous variations and permutations of the above described systems and techniques that fall within the spirit and scope of the disclosed technology as set forth in the appended claims. For example, while specific terminology has been employed above to refer to electronic design automation processes, it should be appreciated that various examples of the disclosed technology may be implemented using any desired combination of electronic design automation processes.

What is claimed is:

1. A method, executed by at least one processor of a computer, comprising:
   receiving a layout design;
   performing a machine learning-based clustering process to separate layout features in the layout design into groups of layout features;
   determining preliminary corrections for layout features in each of the groups of layout features;
   applying the preliminary corrections to the layout design to generate a pre-processed layout design;
   performing an inverse lithography technology process on the pre-processed layout design to generate a processed layout design; and
   storing information of the processed layout design.

2. The method recited in claim 1, wherein the machine learning-based clustering process comprises:
   extracting a feature vector for each of the layout features; and
   mapping the set of feature vectors into hyperboxes of a hyperspace.

3. The method recited in claim 1, wherein the determining preliminary corrections is based on performing another inverse lithography technology process for each of the groups of layout features.

4. The method recited in claim 3, wherein the another inverse lithography technology process and the inverse lithography technology process employ the same inverse lithography technology model.

5. The method recited in claim 1, wherein the performing an inverse lithography technology process comprises:
   determining parameters (recipe) for the inverse lithography technology process based on layout features selected from each of the groups of layout features.

6. The method recited in claim 1, wherein the performing inverse lithography technology process comprises:
   performing a first inverse lithography technology sub-process to generate sub-resolution assist features; and
   performing a second inverse lithography technology sub-process to generate the processed layout design.

7. The method recited in claim 1, further comprising:
   manufacturing masks based on the processed layout design.

8. One or more non-transitory computer-readable media storing computer-executable instructions for causing one or more processors to perform a method, the method comprising:

receiving a layout design;

performing a machine learning-based clustering process to separate layout features in the layout design into groups of layout features;

determining preliminary corrections for layout features in each of the groups of layout features;

applying the preliminary corrections to the layout design to generate a pre-processed layout design;

performing an inverse lithography technology process on the pre-processed layout design to generate a processed layout design; and storing information of the processed layout design.

9. The one or more non-transitory computer-readable media recited in claim 8, wherein the machine learning-based clustering process comprises:

extracting a feature vector for each of the layout features; and mapping the set of feature vectors into hyperboxes of a hyperspace.

10. The one or more non-transitory computer-readable media recited in claim 8, wherein the determining preliminary corrections is based on performing another inverse lithography technology process for each of the groups of layout features.

11. The one or more non-transitory computer-readable media recited in claim 10, wherein the another inverse lithography technology process and the inverse lithography technology process employ the same inverse lithography technology model.

12. The one or more non-transitory computer-readable media recited in claim 8, wherein the performing an inverse lithography technology process comprises:

determining parameters (recipe) for the inverse lithography technology process based on layout features selected from each of the groups of layout features.

13. The one or more non-transitory computer-readable media recited in claim 8, wherein the performing inverse lithography technology process comprises:

performing a first inverse lithography technology sub-process to generate sub-resolution assist features; and performing a second inverse lithography technology sub-process to generate the processed layout design.

14. A system, comprising:

one or more processors, the one or more processors programmed to perform a method, the method comprising:

receiving a layout design;

performing a machine learning-based clustering process to separate layout features in the layout design into groups of layout features;

determining preliminary corrections for layout features in each of the groups of layout features;

applying the preliminary corrections to the layout design to generate a pre-processed layout design;

performing an inverse lithography technology process on the pre-processed layout design to generate a processed layout design; and storing information of the processed layout design.

15. The system recited in claim 14, wherein the machine learning-based clustering process comprises:

extracting a feature vector for each of the layout features; and mapping the set of feature vectors into hyperboxes of a hyperspace.

16. The system recited in claim 14, wherein the determining preliminary corrections is based on performing another inverse lithography technology process for each of the groups of layout features.

17. The system recited in claim 16, wherein the another inverse lithography technology process and the inverse lithography technology process employ the same inverse lithography technology model.

18. The system recited in claim 14, wherein the performing an inverse lithography technology process comprises:

determining parameters (recipe) for the inverse lithography technology process based on layout features selected from each of the groups of layout features.

19. The system recited in claim 14, wherein the performing inverse lithography technology process comprises:

performing a first inverse lithography technology sub-process to generate sub-resolution assist features; and performing a second inverse lithography technology sub-process to generate the processed layout design.

* * * * *